United States Patent
Hirayu

(10) Patent No.: US 8,921,973 B2
(45) Date of Patent: Dec. 30, 2014

(54) SEMICONDUCTOR DEVICE

(71) Applicant: Kabushiki Kaisha Toshiba, Tokyo (JP)

(72) Inventor: Tsuyoshi Hirayu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/779,631

(22) Filed: Feb. 27, 2013

(65) Prior Publication Data

US 2014/0239437 A1    Aug. 28, 2014

(51) Int. Cl.
*H01L 29/94* (2006.01)
*H01L 21/762* (2006.01)
*H01L 29/06* (2006.01)

(52) U.S. Cl.
CPC ...... *H01L 29/0649* (2013.01); *H01L 21/76224* (2013.01)
USPC .......... 257/516; 257/532; 257/E21.008; 257/E29.346

(58) Field of Classification Search
CPC ............. H01L 27/10894; H01L 27/10897; H01L 29/66181; H01L 29/945
See application file for complete search history.

(56) References Cited

U.S. PATENT DOCUMENTS

| | | | |
|---|---|---|---|
| 7,511,346 B2 * | 3/2009 | Yeh et al. ............ | 257/370 |
| 7,759,200 B2 * | 7/2010 | Disney et al. ......... | 438/270 |
| 7,759,731 B2 * | 7/2010 | Disney et al. ......... | 257/334 |
| 8,110,853 B2 * | 2/2012 | Voldman .............. | 257/170 |
| 8,378,445 B2 * | 2/2013 | Elattari et al. ....... | 257/508 |
| 8,609,486 B1 * | 12/2013 | Smeys et al. ......... | 438/243 |
| 8,637,958 B2 * | 1/2014 | Dube et al. ........... | 257/532 |
| 2002/0008267 A1 * | 1/2002 | Weijand et al. ...... | 257/301 |
| 2006/0124982 A1 * | 6/2006 | Ho et al. .............. | 257/304 |
| 2008/0142924 A1 * | 6/2008 | Hsu et al. ............. | 257/532 |
| 2009/0039423 A1 | 2/2009 | Ikeda | |
| 2009/0039467 A1 * | 2/2009 | Chinthakindi et al. ... | 257/534 |
| 2009/0184356 A1 * | 7/2009 | Brodsky et al. ...... | 257/301 |
| 2009/0194844 A1 * | 8/2009 | Richter ................ | 257/532 |
| 2011/0193193 A1 * | 8/2011 | Dube et al. ........... | 257/532 |
| 2012/0091593 A1 * | 4/2012 | Cheng et al. ......... | 257/774 |
| 2012/0133023 A1 * | 5/2012 | Booth et al. ......... | 257/532 |
| 2013/0200482 A1 * | 8/2013 | Fang et al. ........... | 257/506 |
| 2014/0048904 A1 * | 2/2014 | Zundel et al. ........ | 257/499 |

FOREIGN PATENT DOCUMENTS

JP    2010272598 A    12/2010
JP    2011049282 A    3/2011

* cited by examiner

*Primary Examiner* — Minh-Loan Tran
*Assistant Examiner* — Fazli Erdem
(74) *Attorney, Agent, or Firm* — Patterson & Sheridan LLP

(57) ABSTRACT

According to one embodiment, the semiconductor device with element isolation by DTI has a layer of the first electroconductive type formed on a substrate. The semiconductor layer of the second electroconductive type is formed on the embedding layer. The first DTI has the following structure: a trench is formed from the surface of the semiconductor layer through the first layer into the substrate and surrounds the semiconductor layer, and an insulator is formed in the trench. The second DTI is formed around the periphery of the semiconductor layer. The first electrode is connected to the first region of the semiconductor layer divided by the first DTI. The second electrode is connected to the second region of the semiconductor layer divided as mentioned previously. The first region and the second region form electrode plates and the first DTI forms the dielectric, to thereby form a capacitor.

16 Claims, 13 Drawing Sheets

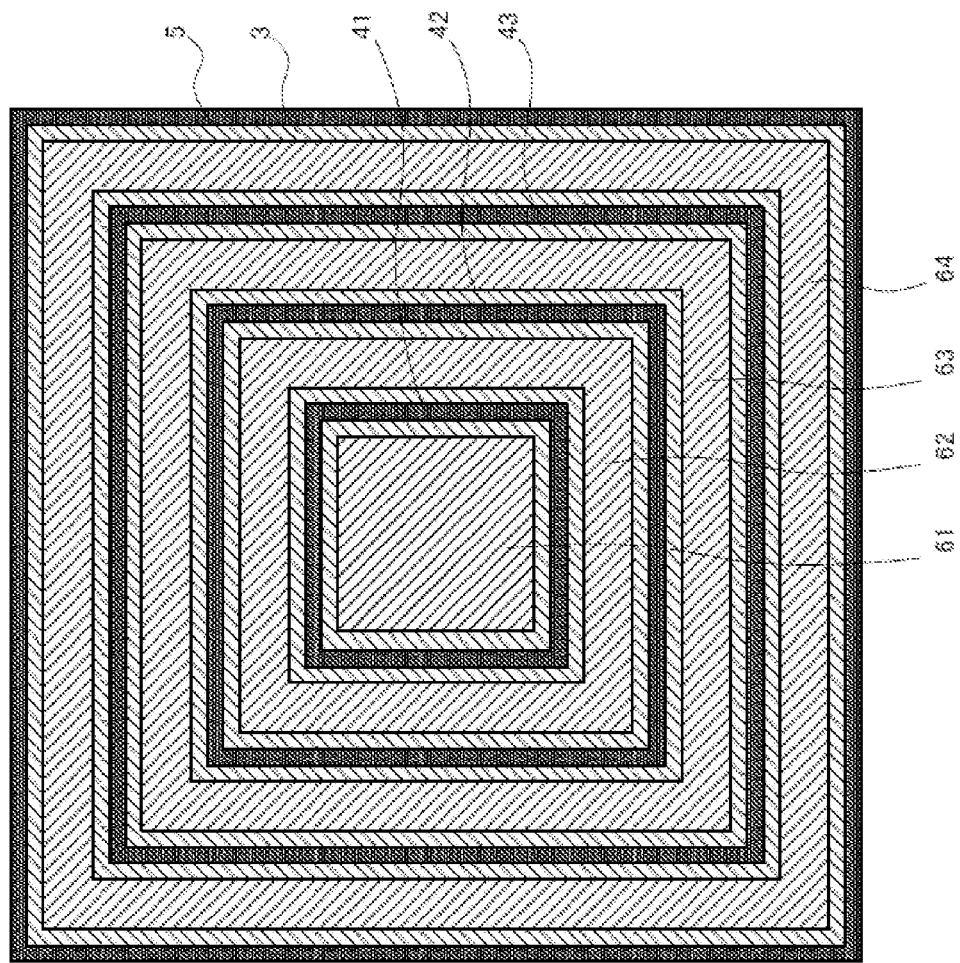

SEMICONDUCTOR DEVICE

FIELD

Embodiments described herein relate to a semiconductor device.

BACKGROUND

As an element isolation method of semiconductor devices, there is the Deep Trench Isolation (DTI) technology. Compared with the conventional PN junction isolation, the DTI element isolation scheme has the advantage that the device packing can be decreased, while maintaining low leakage characteristics between adjacent devices.

In a semiconductor device, in order to suppress voltage variation in the power supply line, a decoupling capacitor is connected to the power supply line. The variation in the voltage of the power supply line is generated due to the variation in the current flow (draw) of the device elements. Therefore, as a way to suppress voltage variation in the power supply, it would be effective to connect the decoupling capacitor close to the device element that causes the current flow in the power supply line to vary significantly. However, when there are a large number of elements with significant variation in current, the number of decoupling capacitors required to stabilize the voltage also increases.

The semiconductor devices may, for example, incorporate Metal Insulator Metal (MIM) capacitors as the decoupling capacitors. The MIM capacitor is formed by sequentially laminating an insulating layer and a metal layer on an underlying metal layer. Consequently, when a large capacitance is required, the surface area of the capacitor becomes larger. In particular, when a high voltage rated capacitor is required, the insulating layer becomes thicker, and the area of the capacitor becomes even larger.

As a result, when a number of decoupling capacitors are formed in the semiconductor device of 1 chip, the chip area becomes much larger.

Consequently, there is a demand for a semiconductor device where capacitors with high capacitance and high voltage rating can be formed with a small area.

DESCRIPTION OF THE DRAWINGS

FIG. 6A is a plane view illustrating an example of the pattern layout of the capacitor of the semiconductor device in the first embodiment.

DETAILED DESCRIPTION

In general, according to one embodiment, the semiconductor device with element isolation by DTI has a substrate of the first electroconductive type, a layer of the first electroconductive type, a semiconductor layer of the second electroconductive type, a first DTI, a second DTI, a first electrode, and a second electrode. The layer of the first electroconductive type is formed on the substrate. The semiconductor layer of the second electroconductive type is formed on the layer. The first DTI has the following structure: a trench is formed from the surface of the semiconductor layer through the layer into the substrate and extends into the semiconductor layer and surrounds a device region, and an insulator is formed in the trench. The second DTI having the same structure is formed around the periphery of the first DTI. The first electrode is connected to the first region of the semiconductor layer surrounded by the first DTI. The second electrode is connected to the second region of the semiconductor layer surrounding the first DTI region. The first region and the second region include electrodes in the form of the first and second regions, and the first DTI is used as a dielectric layer. In this way, a three dimensional parallel plate capacitor is formed. This structure forms a capacitor in which the area of the dielectric plates is independent of the surface area in the plane, i.e. diameter direction, of the underlying substrate on or in which they are formed, as the dielectric plates extend in a plane other than in the plane of the substrate, for example perpendicular thereto. Thus, in one aspect, the dielectric plates may extend in a direction perpendicular to the plane of the substrate. They may, for example, be formed in regions of the substrate bounded by isolation structures, where the isolation structures form a dielectric plate of capacitor.

In the following, the embodiments will be explained with reference to the drawings. The same numbers will be used throughout the drawings to represent the same or similar parts.

First Embodiment

Figure 1A:
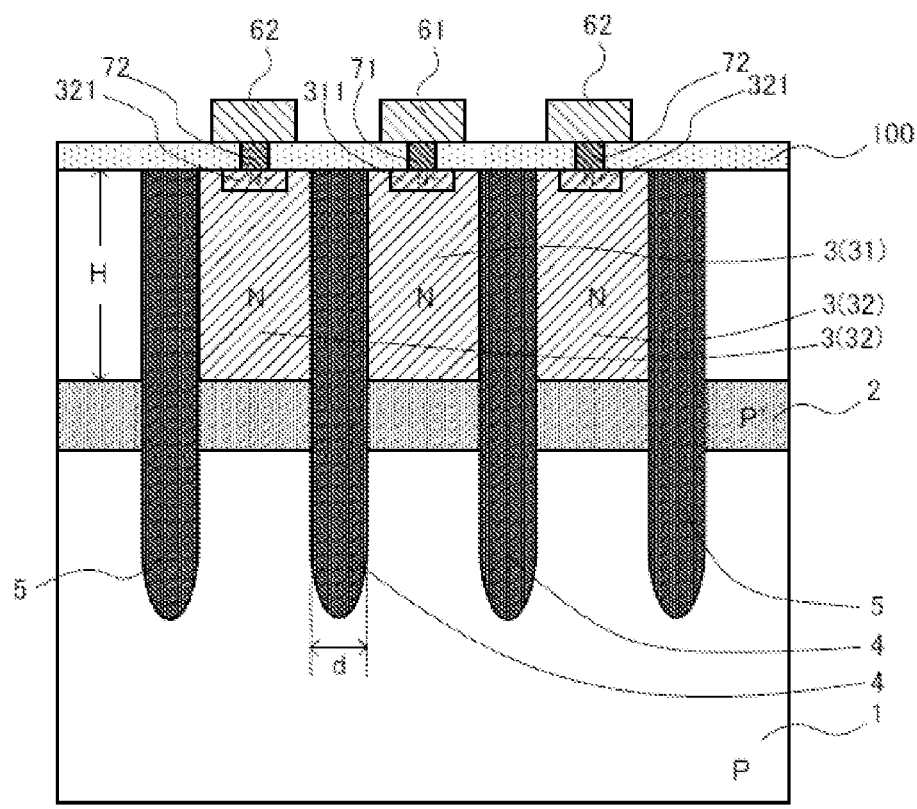
FIG. 1A is a schematic cross-sectional view illustrating an example of the structure of the semiconductor device of a first embodiment.
Figure 1B:
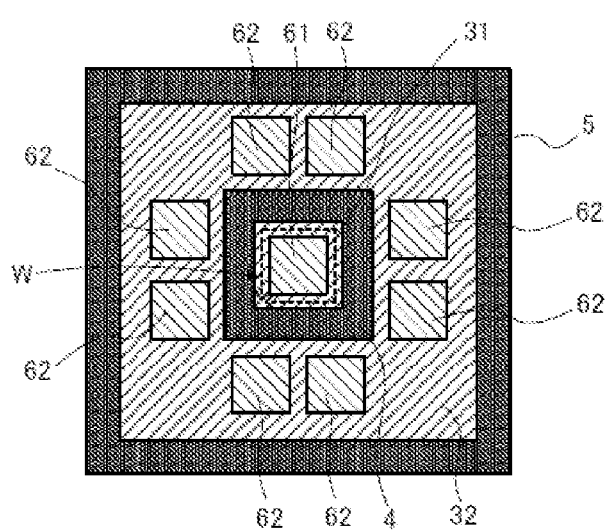
FIG. 1B is a schematic plane view of the semiconductor device of FIG. 1A.

FIG. 1A is a schematic cross-sectional view illustrating an example of the structure of the semiconductor device in the first embodiment. FIG. 1B is a schematic plane view thereof. Herein, the terminology p- or n-type means having properties of a material which is p-doped or n-doped, respectively.

The semiconductor device in this embodiment is a semiconductor device with element isolation by Deep Trench Isolation (DTI). According to the present embodiment, the operation for forming DTI is utilized to form the capacitor used as the decoupling capacitor. Here, explanation will be made for an example of the semiconductor device, i.e., the capacitor, formed on a p-type silicon substrate.

As shown in FIG. 1A, the semiconductor device in the present embodiment has a p-type substrate 1, a p+ type layer 2 formed on the p-type substrate 1, an n-type semiconductor layer 3 formed on the p+ type layer 2, a DTI 4, where a trench is formed for the surface of the n-type semiconductor layer 3 through the p+ type layer 2 to the interior of the p-type substrate 1, and an insulator is formed in the trench, and a DTI 5 formed on the periphery of the n-type semiconductor layer 3.

Here, suppose the thickness of the layer of the n-type semiconductor layer 3 is H, and the width of the trench of the DTI 4 is d.

As shown in FIG. 1B, the DTI 4 has a trench formed to encircle or surround a portion of the n-type semiconductor layer 3, i.e., portion 31.

The n-type semiconductor layer 3 is divided by the DTI 4 into two regions. Here, one region is an n-type semiconductor layer 31, and the remaining region is an n-type semiconductor layer 32. An electrode 61 is connected to the n-type semiconductor layer 31, and an electrode 62 is connected to the n-type semiconductor layer 32. However, for purposes of understanding the structure of the capacitor formed with these features, the doped layers to either side of a dielectric filled DTI structure form the electrodes of the capacitor, and the dielectric filled DTI is the dielectric layer of the capacitor.

For the connection of the electrodes 61 and 62 to the semiconductor layers 31, 32, a contact 71 and a contact 72 are formed through an insulating layer 100 formed on the upper surface of the n-type semiconductor layer 3. Also, n+ doped regions 311 and 321 are formed between the contacts and the semiconductor layers 31 and 32.

The DTI 4 is formed in an annular shape (rectangular in cross section in this embodiment) to extend into the n-type layer and segment it into the n-type semiconductor layer 31 and the n-type semiconductor layer 32 as shown in FIG. 1B. Consequently, the semiconductor layers 31 and 32 become parallel electrode plates facing each other with the DTI 4 forming the dielectric layer sandwiched there between.

Figure 1C:
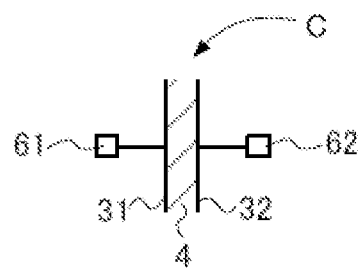
FIG. 1C is an electrical equivalent circuit of the semiconductor device of FIG. 1A.

Consequently, here, as can be seen from the equivalent circuit shown in FIG. 1C, a capacitor C is formed with the parallel electrode plates made of the semiconductor layers 31 and 32 and with the dielectric made of the DTI 4.

The width of the parallel electrode plates is equal to the length W of one circumference of the DTI 4.

Here, the capacitance C of the capacitor C is represented by the formula of $C = H \cdot W/d$, where H represents the layer thickness of the n-type semiconductor layers 31 and 32, W represents the length of the circumference of the DTI 4, and d represents the width of the trench of the DTI 4.

That is, the capacitance C of the capacitor C is larger when the thickness H of the n-type semiconductor layers 31 and 32 and the length W of the circumference of the DTI 4 are larger, as the width d of the trench of the DTI 4 becomes smaller, assuming the materials of the capacitor are unchanged.

Consequently, when the surface area of the substrate on which the capacitor C is formed is to be made smaller, one may increase the thickness H of the n-type semiconductor layers 31 and 32 or decrease the width d of the trench of the DTI.

Here, in order to decrease the width d of the trench of the DTI 4, the electric field applied on the DTI 4 should be higher. Consequently, when there is a demand for a high voltage rating, the width d of the trench of the DTI 4 is determined corresponding to the voltage rating, and the thickness H i.e., depth into the substrate of, the n-type semiconductor layers 31 and 32 is increased.

As a result, it is possible to form a capacitor with a high voltage rating, a large capacitance and a small area.

FIG. 2A through FIG. 2E are cross-sectional views illustrating the steps of the manufacturing operation of the semiconductor device according to the present embodiment.

Figure 2A:
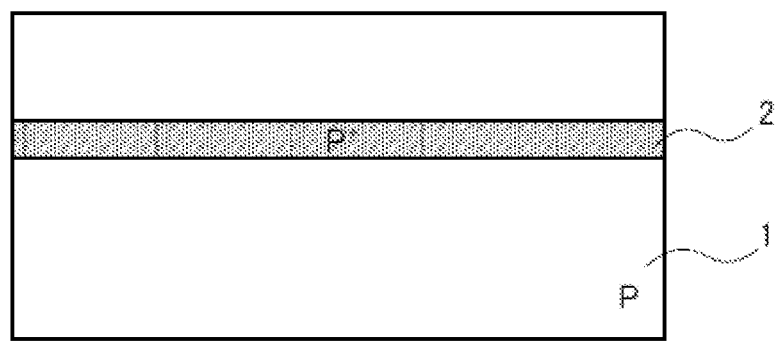
FIG. 2A to FIG. 2E are cross-sectional views illustrating the steps for forming the semiconductor device in the first embodiment.
Figure 2B:
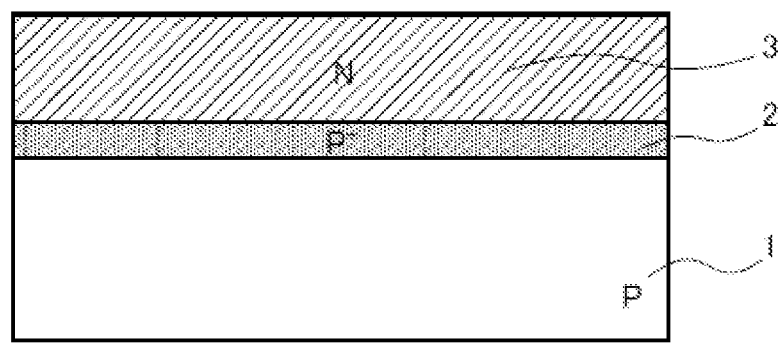

As shown in FIG. 2A, first, a p+ type layer 2 is formed on a p-type substrate 1. Then, as shown in FIG. 2B, on the p+ type layer 2, an n-type semiconductor layer 3 is formed by epitaxial film formation.

Here, instead of the n-type semiconductor layer 3, a p-type semiconductor layer may also be formed.

Figure 2C:
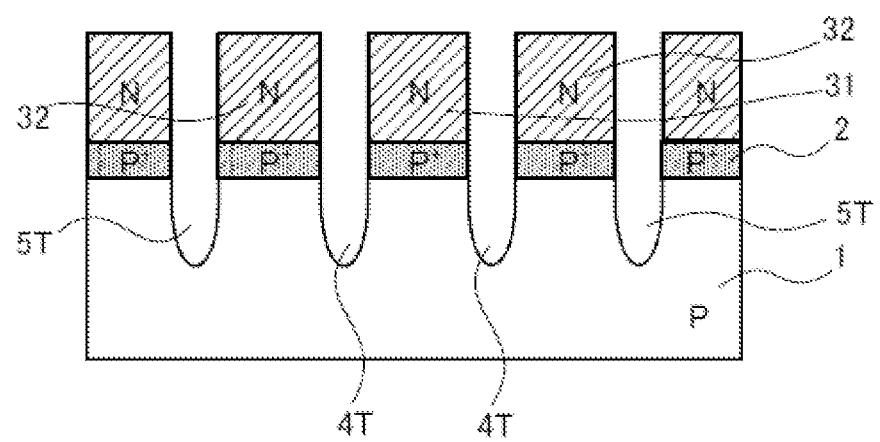

Then, as shown in FIG. 2C, by use of a patterned masking layer (not shown) and reactive ion etching (RIE), a trench 4T and a trench 5T are formed from the surface of the n-type semiconductor layer 3 through the p+ type layer 2 and into the interior of the p-type substrate 1. Due to formation of the trench 4T, the n-type semiconductor layer 3 is bisected into n-type semiconductor layer 31 and n-type semiconductor layer 32.

Then, after oxidation of the trench 4T and trench 5T walls by thermal oxidation, an insulator (dielectric) is deposited in the trench 4T and trench 5T. Here, as the insulator, $SiO_2$ or other silicon oxide, or a laminated structure of a silicon oxide film and a polysilicon film is adopted.

Figure 2D:
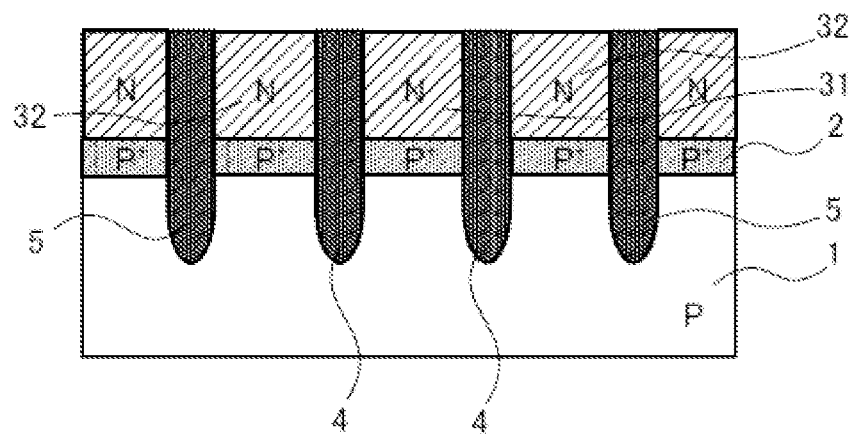

As a result, as shown in FIG. 2D, the DTI 4 and the DTI 5 are structures formed. The DTI structures may then be incorporated as a capacitor, by supplying external electrodes 61, 62 in electrical connection with the n-type layers 31, 32.

Figure 2E:
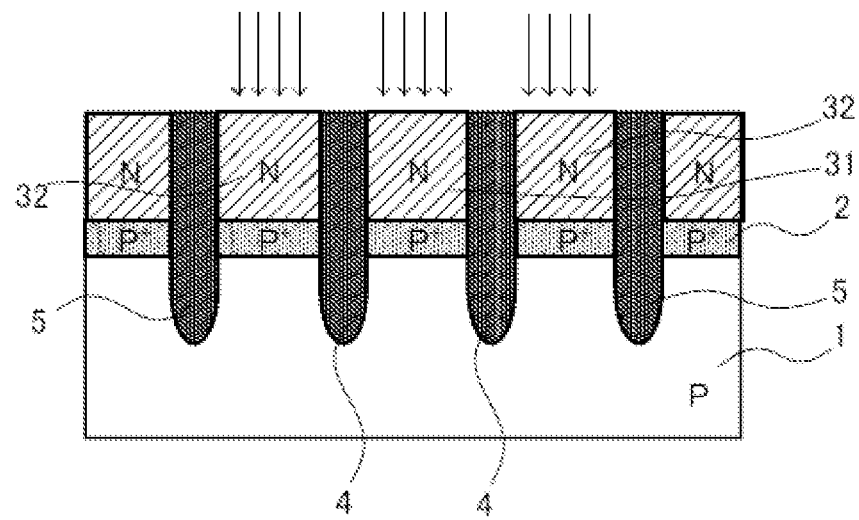

Then, as shown in FIG. 2E, by employing ion implanting, arsenic, phosphorus, or other n-type impurity is implanted into the n-type semiconductor layers 31 and 32 to convert the n-type semiconductor layers 31 and 32 to semiconductor electrodes.

Figure 3A:
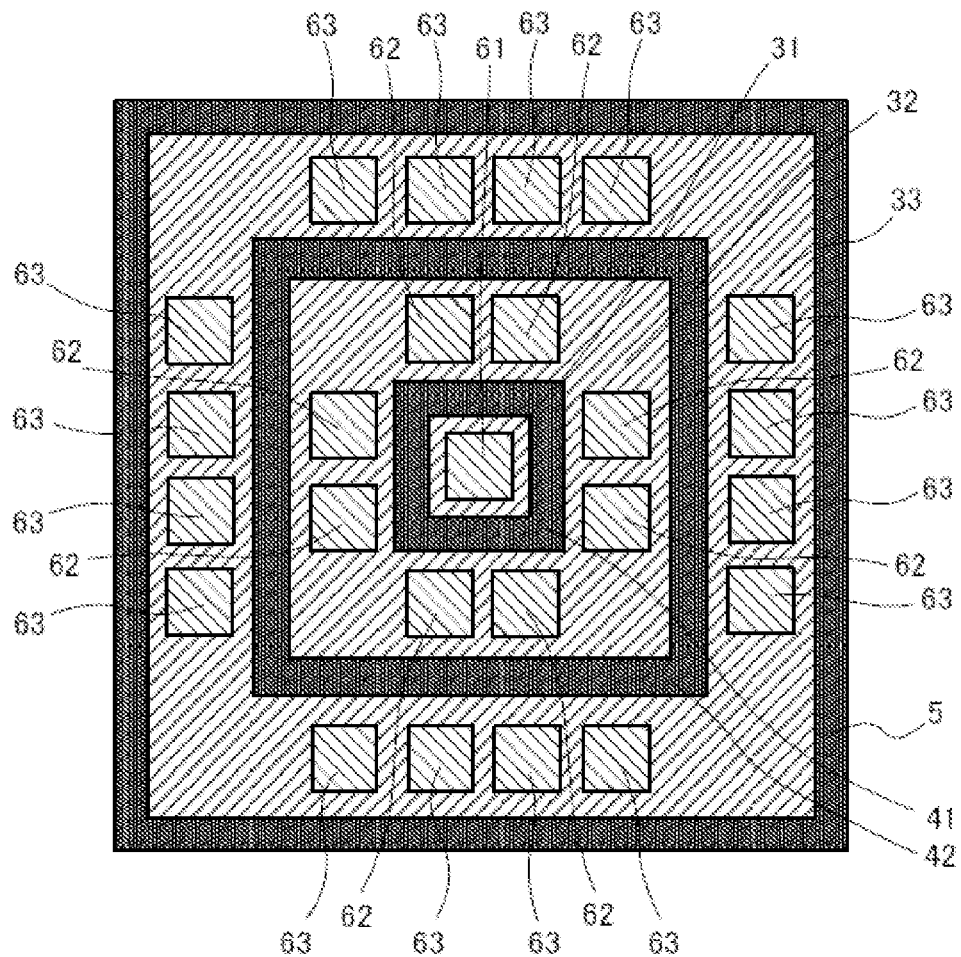
FIG. 3A is a schematic plane view illustrating another example of the structure of the semiconductor device in the first embodiment.

FIG. 3A is a schematic plan (top) view illustrating the semiconductor device where two capacitors are formed in a single n-type semiconductor layer region. In this example, the n-type semiconductor layer 3 is sectored into three concentric regions by forming DTI 41 around a first region 31 of n-type layer 3, and providing a second and DTI 42 surrounding DTI 41 with a second portion of the n-type semiconductor layer 32 positioned between DTI 1 and DTI 2. As a result, the n-type semiconductor layer 3 is divided to n-type semiconductor layers 31, 32, and 33. The electrodes 61, 62, 63 are connected to the n-type semiconductor layers 31, 32, and 33, respectively. A third DTI 5 is also formed, surrounding and spaced from DTI 42, to isolate the capacitor structures from the remainder of the underlying substrate.

Figure 3B:
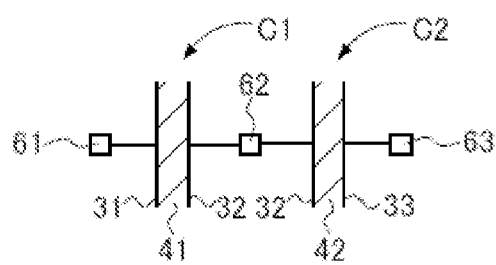
FIG. 3B is an electrical equivalent circuit of the semiconductor device of FIG. 3A.

FIG. 3B is a diagram illustrating the equivalent electric circuit of the semiconductor device. In this example, a capacitor C1 including the n-type semiconductor layers 31 and 32 and the DTI 41, and a capacitor C2 including the n-type semiconductor layers 32, 33 and the DTI 42 are formed.

In this way, in the structure shown in FIG. 3A, two capacitors can be formed for one n-type semiconductor layer region, so that it is possible to increase the utilization efficiency of the chip area.

Figure 4A:
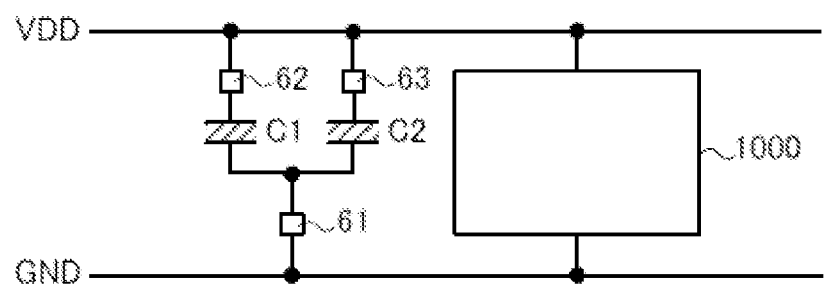
FIG. 4A and FIG. 4B are circuit diagrams illustrating examples of the circuitry of the semiconductor device to electrodes in the first embodiment.
Figure 4B:
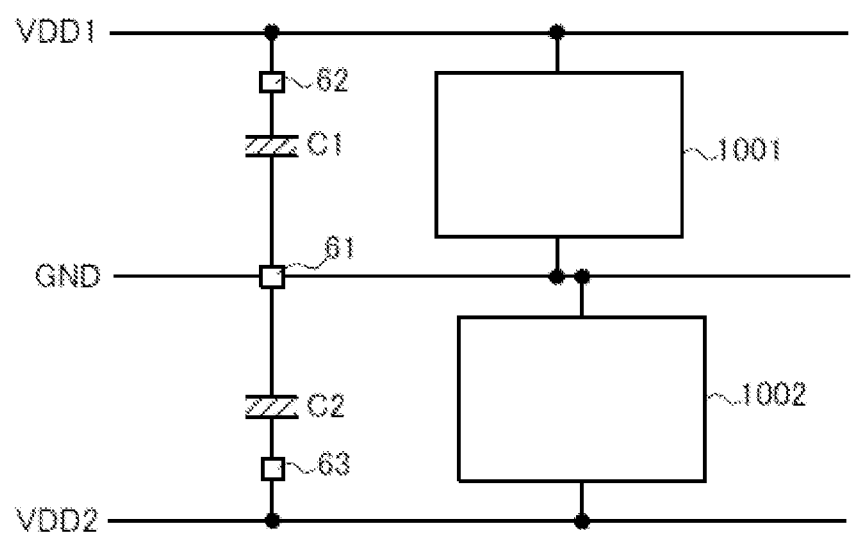

FIG. 4A and FIG. 4B show a connection example of the electrodes 61, 62, 63 when the two capacitors shown in FIG. 3B are adopted as the decoupling capacitors.

As shown in FIG. 4A, the capacitors C1, C2 are decoupling capacitors with respect to a circuit 1000. In this case, the electrode 61 is connected to the ground potential GND, and the electrodes 62, 63 are connected to the power supply line VDD of the circuit 1000.

On the other hand, as shown in FIG. 4B, the capacitor C1 is taken as a decoupling capacitor for circuit 1001, and the capacitor C2 is taken as the decoupling capacitor for a circuit 1002. The electrode 61 is connected to the ground potential GND, the electrode 62 is connected to the power supply line VDD1 of the circuit 1001, and the electrode 63 is connected to the power supply line VDD2 of the circuit 1002.

Figure 5:
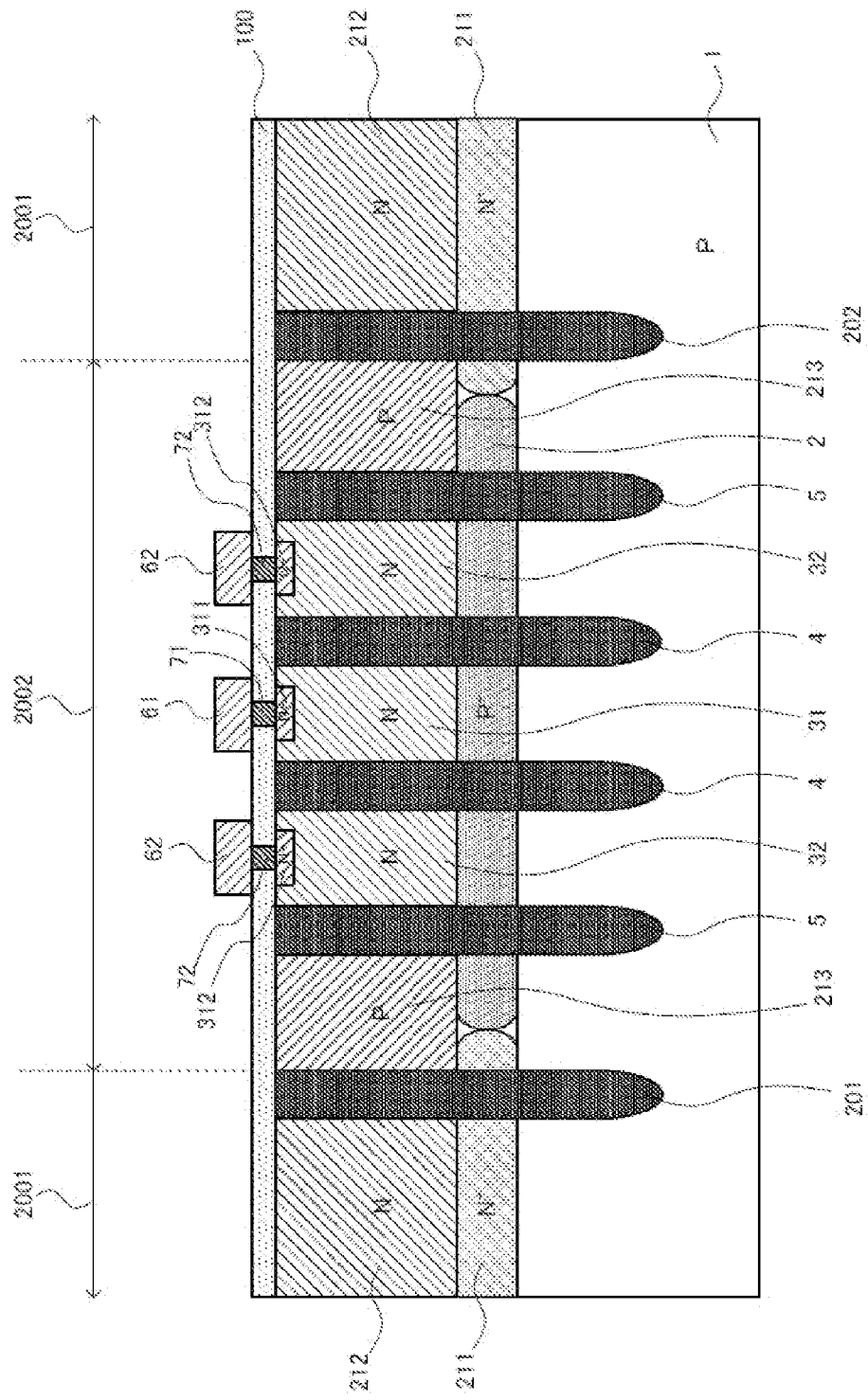
FIG. 5 is a schematic cross-sectional view illustrating an example of the structure when the capacitor of the semiconductor device in the first embodiment is formed in the element isolation region.

FIG. 5 is a schematic cross-sectional view illustrating an example of the structure when the capacitor of the semiconductor device in this embodiment is formed in the element isolation region.

The element isolation region is the region arranged for isolating the transistors, and it is originally a void region. Here, in order to make an effective use of this void region, capacitors are formed in the element isolation region.

In the example shown in FIG. 5, isolation of an element region 2001 is formed by DTI 202 having DTI 201 disposed within its boundary. Consequently, the region between within DTI 202 becomes an element region 2002. As shown in FIG. 5, in this element region 2002, the same capacitors as those shown in the example shown in FIG. 1A are formed.

In the element region 2001, an n+ type layer 211 is formed on the p-type substrate 1, and, an n-type semiconductor layer 212 is formed on the n+ type layer 211. Within DTI 4 and DTI 5, as well as partially within DTI 202, a p-type semiconductor layer 213 is formed.

As a result, an additional capacitor is formed around the element isolation regions DTI 4 and DTI 5, so that the chip area can be efficiently utilized.

In the following, FIG. 6A shows an example of the layout pattern of the capacitor in this embodiment with a high utilization efficiency of the chip area.

In the example shown in FIG. 6A, DTI 41, DTI 42, and DTI 43 that divide the n-type semiconductor layer 3 are formed in a concentric square shape, and the ring circumference increases in the order of DTI 41, DTI 42, DTI 43 a further DTI 5 structure to isolate the capacitors from the remainder of the substrate.

An electrode 61 is formed on the inner side of the DTI 41. An electrode 62 is formed between the DTI 41 and the DTI 42. An electrode 63 is formed between the DTI 42 and the DTI 43. An electrode 64 is formed on the outer side of the DTI 43.

Figure 6B:
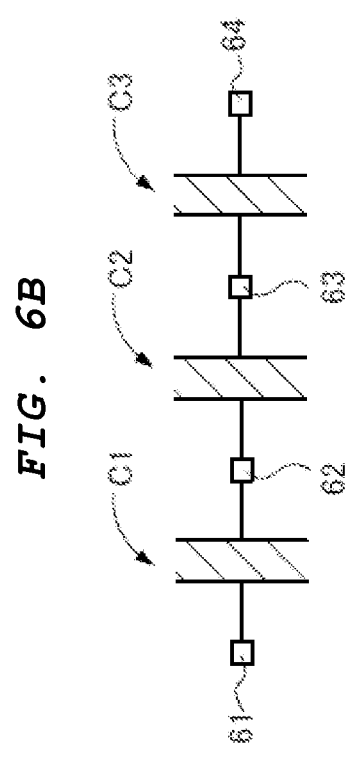
FIG. 6B is an electrical equivalent circuit of the capacitor of the semiconductor device in the first embodiment.

With the configuration, as can be seen from the electrical equivalent circuit shown in FIG. 6B, the capacitor C1 is formed between the electrode 61 and the electrode 62, the capacitor C2 is formed between the electrode 62 and the electrode 63, and the capacitor C3 is formed between the electrode 63 and the electrode 64.

In this case, the effective width of the electrode plate of each capacitor corresponds to the length of the circumference of each of the DTI 41, DTI 42, and DTI 43. Consequently, the capacitance of each capacitor per chip area becomes larger as the circumference of the DTI regions increase.

Figure 6C:
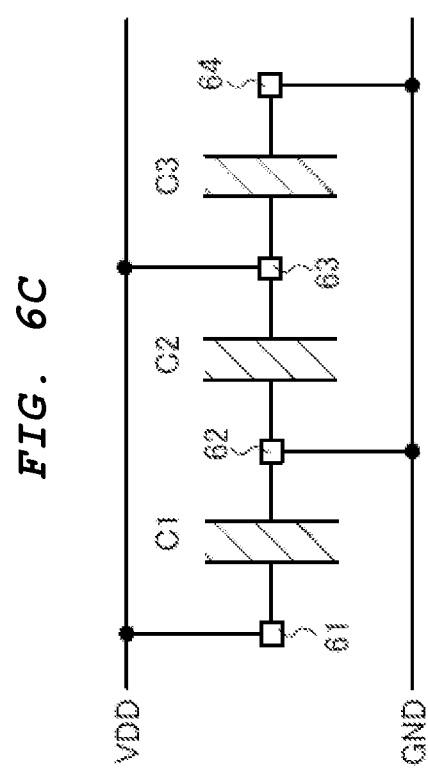
FIG. 6C is a diagram illustrating an example of connection of the electrodes of the capacitor of the semiconductor device in the first embodiment.

FIG. 6C shows an example of connection of the various electrodes when the capacitors C1, C2, C3 are adopted as the decoupling capacitors.

In this case, the electrodes 61, 62, 63, 64 are alternately connected to the power supply line VDD and the ground potential GND. For example, the electrodes 61, 63 are connected to the power supply line VDD, and the electrodes 62, 64 are connected to the ground potential GND.

According to this embodiment as explained above, the semiconductor layers divided by the DTIs are taken as the parallel electrode plates, and the DTI is taken as the dielectric in forming the capacitors. As a result, it is possible to form the capacitors with high voltage rating and high capacitance on a small area. Also, as it is possible to form plural capacitors on the same area, it is possible to increase the utilization efficiency of the chip area. Also, as the capacitors are formed in the element isolation region as the originally void region, it is possible to make effective utilization of the chip area.

Second Embodiment

Figure 7:
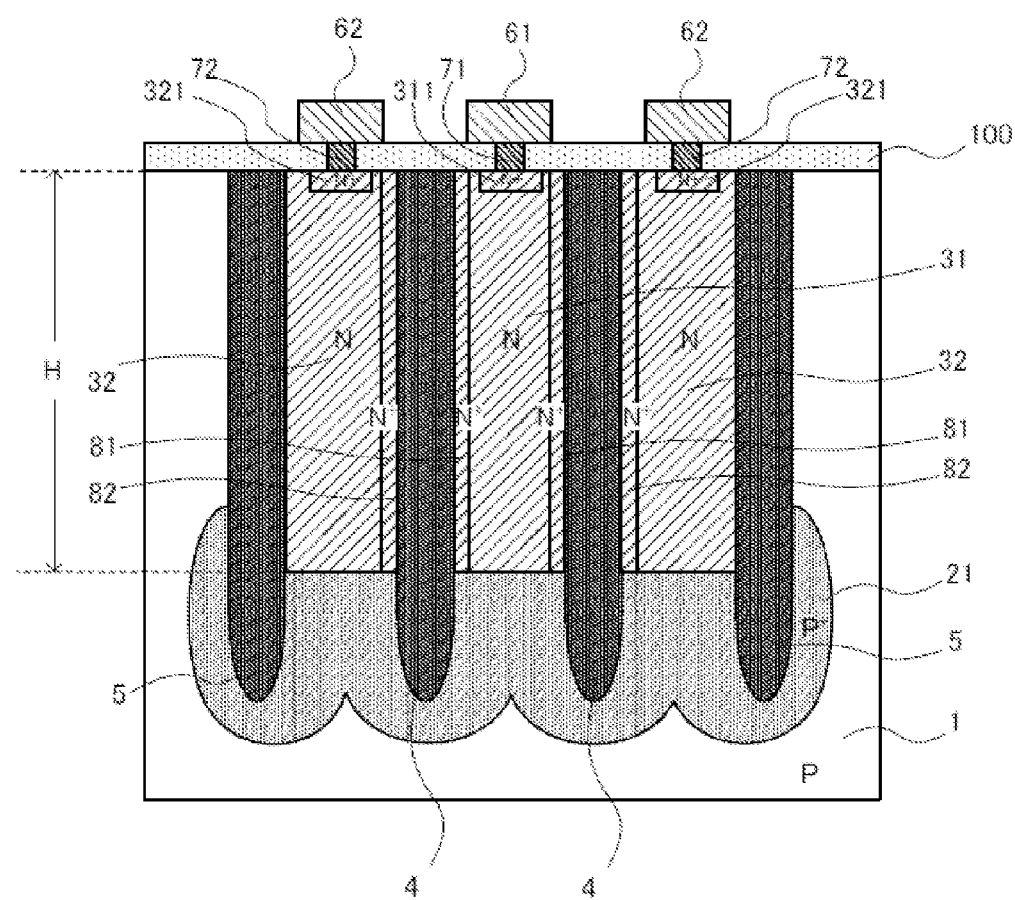
FIG. 7 is a schematic cross-sectional view illustrating an example of the structure of the semiconductor device in a second embodiment.

FIG. 7 is a schematic cross-sectional view illustrating an example of the structure of the semiconductor device in the second embodiment. The same keys as those in the above in the first embodiment are adopted here, so they will not be explained in detail again.

The structure of the semiconductor device in this embodiment is basically the same as that of the semiconductor device in the first embodiment. As to be explained later, for the semiconductor device of the present embodiment, the trenches that form DTI 4 and DTI 5 are formed in two steps, so that the trenches may be deeper. As a result, the thickness H of the n-type semiconductor layers 31 and 32 can be increased, thereby increasing the plate area, and the capacitance of the capacitor formed therewith can be increased.

According to this embodiment, n+ type regions 81, 82 with a high impurity concentration are formed in the n-type semiconductor layers 31 and 32 near the DTI 4, respectively.

According to the present embodiment, a p+ region 21 is formed on the periphery of the tip portion of each of the DTI 4 and the DTI 5, i.e., in the region of the furthest extension of the DTI structures into the substrate.

FIG. 8A to FIG. 8H are schematic cross-sectional views illustrating the steps of the manufacturing operation of the semiconductor device according to the present embodiment.

Figure 8A:
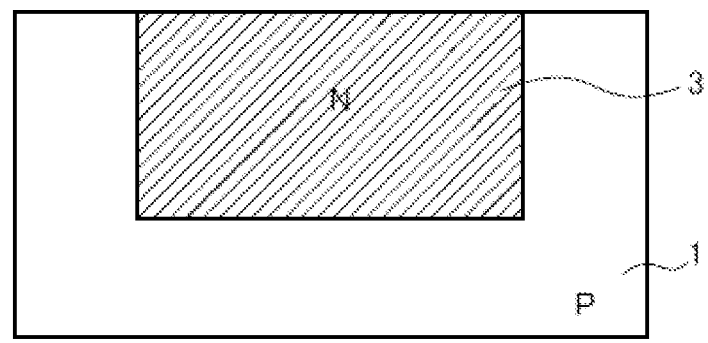
FIG. 8A to FIG. 8H are cross-sectional views illustrating the steps of forming the semiconductor device in the second embodiment.

As shown in FIG. 8A, first an n-type semiconductor layer 3 is formed in the p-type substrate 1.

Figure 8B:
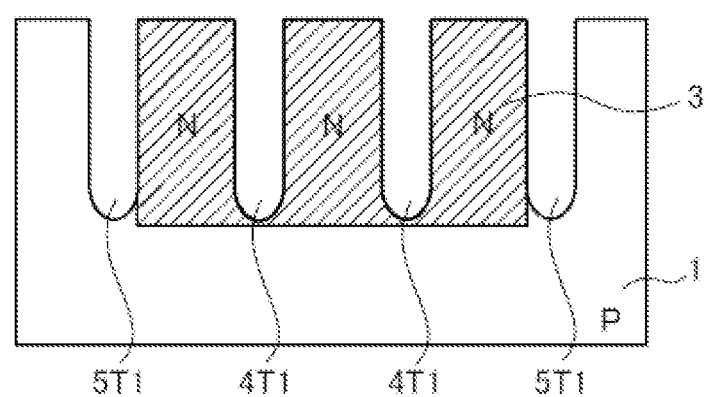

Then, as shown in FIG. 8B, the first depth of the trenches are etched from the surface of the n-type semiconductor layer 3, so that the trench 4T1 and the trench 5T1 are formed.

Figure 8C:
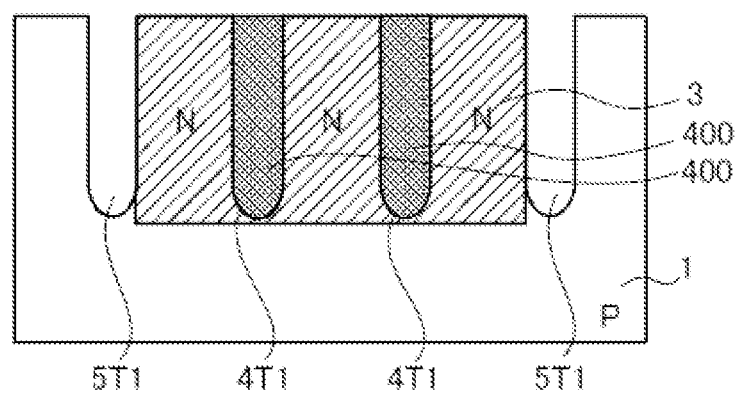

Then, as shown in FIG. 8C, in the trench 4T1, doped polysilicon 400 prepared by doping arsenic or phosphorus or other n-type impurity is deposited. Then, the semiconductor device in this embodiment is heated.

Figure 8D:
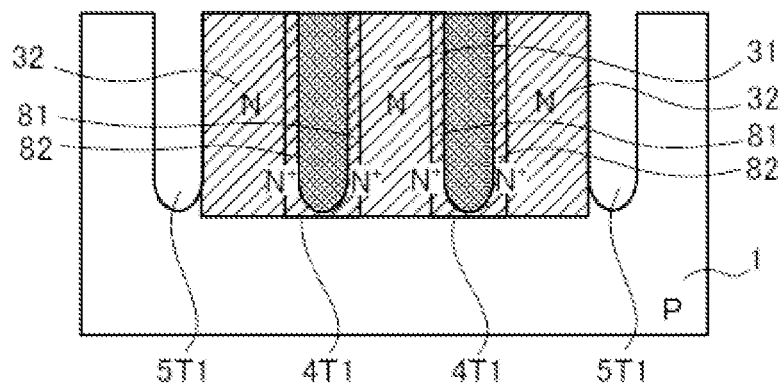

By this heating, the n-type impurity diffuses from the doped polysilicon 400 to the n-type semiconductor layer 3, and, as shown in FIG. 8D, the n+ type regions 81, 82 form on the periphery of the trench 4T1.

Figure 8E:
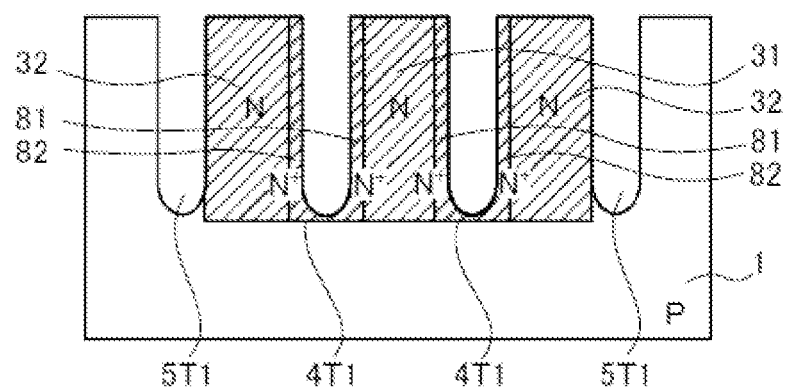
Figure 8F:
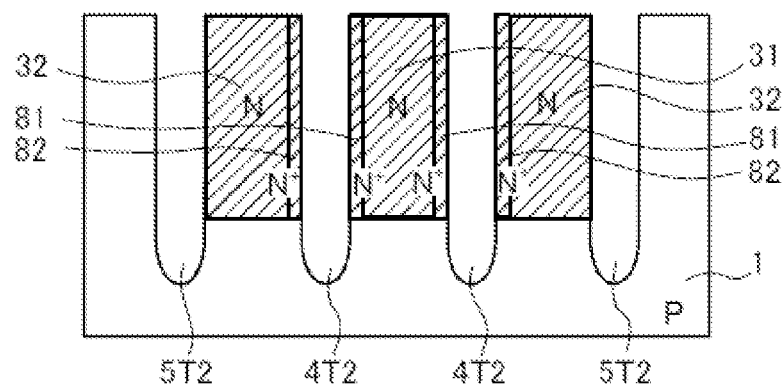

Then, as shown in FIG. 8E, the doped polysilicon 400 is removed from the trench 4T1, and, as shown in FIG. 8F, trenches 4T1 and 5T1 are etched deeper into the substrate 1 to form the final trench 4T2 and trench 5T2 depth.

Figure 8G:
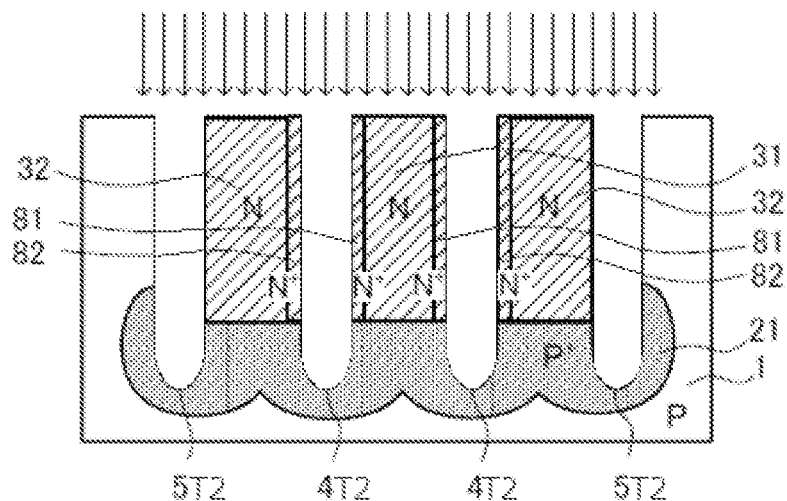

Then, as shown in FIG. 8G, ion implanting is carried out to implant boron or other p-type impurity into the p-type substrate 1, so that the p+ type region 21 is formed on the periphery of the tip portion of each of the trench 4T2 and trench 5T2.

Then, after oxidation by thermal oxidation of the walls of trench 4T2 and trench 5T2, the insulator to form the dielectric plate of the capacitor is deposited in the trench 4T2 and trench 5T2. Here, the insulator may be made of $SiO_2$ or other silicon oxide, or laminated structure of silicon oxide film and polysilicon.

Figure 8H:
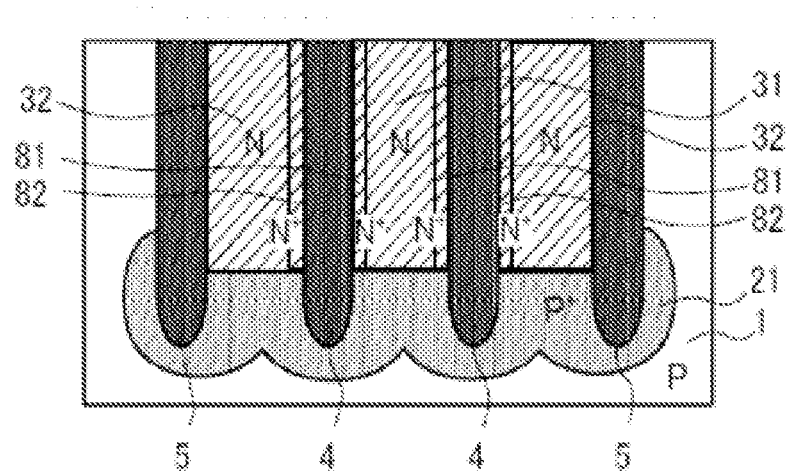

As a result, as shown in FIG. 8H, DTI 4 the DTI 5 are formed. Thereafter, insulating films and electrodes are formed to provide the full capacitor structure shown in FIG. 7.

In this way, according to the present embodiment, the trenches for forming the DTIs are dug in two steps, so that deeper trenches are formed. As a result, it is possible to have larger thickness for the semiconductor layer as the electrode plate of the capacitors, and it is possible to have even larger capacitance of the capacitor per chip area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first layer of a first dopant type;
a second layer of the first dopant type on the first layer;
a third layer of a second dopant type overlying the second layer;
a first closed loop trench including a dielectric material therein and extending at least through the third layer and into the second layer, and surrounding a first region of the second and third layers;
a first electrode connected to the first region of the third layer; and
a second electrode connected to a second region of the third layer around the first closed loop trench.

2. The semiconductor device of claim 1, further comprising a second closed loop trench including a dielectric material therein and extending at least through the third layer and into the second layer, and surrounding the second region of the second and third layers located between the first closed loop trench and the second closed loop trench.

3. The semiconductor device of claim 2, wherein the first layer is a semiconductor substrate.

4. The semiconductor device of claim 2, wherein a dielectric plate of a capacitor is formed of the dielectric material in the first closed loop trench.

5. The semiconductor device of claim 2, wherein the first and second closed loop trenches extend through the second layer and into the first layer.

6. The semiconductor device of claim 2, further comprising:
a third closed loop trench containing a dielectric material therein and surrounding the second closed loop trench and a third region of the second and third layers located between the second trench and the third trench.

7. The semiconductor device of claim 6, wherein:
the dielectric material in the first closed loop trench forms the dielectric plate of a first capacitor, and the dielectric material in the second closed loop trench forms the dielectric plate of a second capacitor, and
the first and the second capacitors are interconnected in series or in parallel.

8. The semiconductor device of claim 7, wherein a capacitance of the second capacitor is greater than a capacitance of the first capacitor.

9. The semiconductor device according to claim 2, wherein the first closed loop trench and the second closed loop trench are formed in an element isolating region which is the region arranged for isolating transistors.

10. The semiconductor device of claim 1, further comprising:
an insulating layer overlying the third layer;
apertures formed in the insulating layer in positions of the insulating layer overlaying the first region and the second region; and
contacts formed in the apertures,
wherein the first electrode is connected to the third layer through the contact in the first region and the second electrode is connected to the third layer through the contact in the second region.

11. The semiconductor device according to claim 1, wherein
the third layer includes a high impurity concentration region near the first closed loop trench.

12. The semiconductor device according to claim 1, wherein
a capacitance of a capacitor consisting of the first region of the third layer, the second region of the third layer, and the dielectric material in the first closed loop trench, is determined by at least the width of the first closed loop trench between the first region and the second region.

13. A semiconductor device with element isolation by deep trench isolation (DTI), the device comprising:
a first layer of a first conductivity type;
a second layer of the first conductivity type formed on the first layer;
a third layer of a second conductivity type formed on the second layer;
a first DTI in which a first trench is formed from a surface of the third layer through the second layer and into the first layer, and surrounding a first region of the third layer, wherein an insulator is embedded in the first trench;
a second DTI in which a second trench is formed from the surface of the third layer through the second layer and into the first layer, and surrounding a second region of the third layer around the first DTI, wherein an insulator is embedded in the second trench;
a first electrode connected to the first region of the third layer; and
a second electrode connected to the second region of the third layer, wherein
the first region and the second region form electrode plates facing each other, and
the first DTI forms a dielectric of a capacitor.

14. The semiconductor device according to claim 13, wherein
the insulator embedded in the first and the second trenches is made of silicon oxide or a laminated structure of a silicon oxide film and polysilicon.

15. The semiconductor device according to claim 13, wherein
the capacitor is a decoupling capacitor.

16. The semiconductor device according to claim 13, wherein
the capacitor is formed in an element isolation region which is the region arranged for isolating transistors.

* * * * *